(12) United States Patent
Tikadar et al.

(10) Patent No.: US 11,781,921 B2
(45) Date of Patent: Oct. 10, 2023

(54) IN-CONTACT CONTINUOUS TEMPERATURE MEASUREMENT PROBE FOR NON-INSULATED ELECTRIC-CURRENT CARRYING CONDUCTOR

(71) Applicant: University of South Carolina, Columbia, SC (US)

(72) Inventors: Amitav Tikadar, Columbia, SC (US); Sowmya Raghu, Columbia, SC (US); Jamil A. Khan, Columbia, SC (US)

(73) Assignee: University of South Carolina, Columbia, SC (US)

( * ) Notice: Subject to any disclaimer, the term of this patent is extended or adjusted under 35 U.S.C. 154(b) by 303 days.

(21) Appl. No.: 17/083,606

(22) Filed: Oct. 29, 2020

(65) Prior Publication Data

US 2021/0181035 A1    Jun. 17, 2021

Related U.S. Application Data

(60) Provisional application No. 62/927,839, filed on Oct. 30, 2019.

(51) Int. Cl.
*G01K 7/04*    (2006.01)
*H10N 10/00*   (2023.01)
*H10N 10/01*   (2023.01)
*H10N 10/10*   (2023.01)
*H10N 10/17*   (2023.01)

(52) U.S. Cl.
CPC .............. *G01K 7/04* (2013.01); *H10N 10/00* (2023.02); *H10N 10/01* (2023.02); *H10N 10/10* (2023.02); *H10N 10/17* (2023.02)

(58) Field of Classification Search
CPC .. G01K 7/04; G01K 1/14; G01K 1/08; H10N 10/17; H10N 10/10; H10N 10/817
USPC ........................................................ 374/179
See application file for complete search history.

(56) References Cited

U.S. PATENT DOCUMENTS 4,043,200 A * 8/1977 Finney .................... G01K 7/06
374/E1.019

FOREIGN PATENT DOCUMENTS

| EP | 4063813 A1 * | 9/2022 | ............... G01K 7/06 |
| KR | 20120040631 A * | 4/2012 | |
| WO | WO-9701746 A1 * | 1/1997 | ............... G01K 1/16 |

\* cited by examiner

*Primary Examiner* — Mirellys Jagan
(74) *Attorney, Agent, or Firm* — Burr & Forman LLP; Douglas L. Lineberry

(57) ABSTRACT

An in-contact temperature measurement probe, which can measure temperature accurately on the surface of a current carrying wire, rod, heater, or other device, while maintaining the safety of the user via employing non-electrically conductive but thermally conductive materials.

10 Claims, 21 Drawing Sheets

IN-CONTACT CONTINUOUS TEMPERATURE MEASUREMENT PROBE FOR NON-INSULATED ELECTRIC-CURRENT CARRYING CONDUCTOR

BACKGROUND

1) Field of the Disclosure

The present disclosure provides an in-contact temperature measurement probe which can measure temperature accurately on the surface of a current carrying wire, rod, heater, or other device.

2) Description of Related Art

Currently, there are no probes that can measure in-contact temperature of the current flowing in a conductive pipe/rod without any insulation. Current practice involves thermocouples in a metallic casing (which is electrically conductive) be used for temperature measurement inside a wire carrying electric current. Ceramic disks with thermocouple ends produced by Stern Lab may be used but are extremely expensive (e.g., $5,000 for a single probe). Infrared imaging and thermal guns are currently used as non-contact probes, such as those manufactured by Fluke, Etekcity, which range in cost from $25-$20,000. Further, accuracy of IR probes depends on calibration and is significantly affected by surface emissivity.

For electrical current carrying wires, tubes, heaters, etc., it is desirable, and often necessary, to know the temperature of the conductor itself especially where temperature is a crucial component in the study. Attempts have been made to measure the surface temperature of electrical conductors by either using a thermocouple with metallic casing or by using a ceramic disc as a contact material in-between a thermocouple probe and the target objects. In the former case, there are high operational risks; in the latter case the price of the thermocouple is exorbitantly expensive. Accordingly, the present disclosure provides a thermal probe that mitigates personnel risk and reduces cost considerably.

Citation or identification of any document in this application is not an admission that such a document is available as prior art to the present disclosure.

SUMMARY

The above objectives are accomplished according to the present disclosure by providing an in-contact temperature probe. The probe may include at least one thermocouple, wherein the at least one thermocouple may be embedded in a non-electrically conducive rod, which may comprise at least one thermally conductive adhesive and the probe may be shaped to conform to a measuring surface shape when placed in contact with the measuring surface. Further, the measuring surface the in-contact temperature probe contacts may include a current carrying wire, rod, or heater. Further, the probe may be designed to withstand temperatures up to 200 degrees Celsius. Still, the rod may include multiple thermocouples with a number of the multiple thermocouples proportional to a length of the rod. Moreover, the probe may detect temperature, heat transfer data, and/or location of weak points in current carrying lines. Further again, the rod may completely enclose an inner space. Yet, the rod may partially enclose an inner space. Still further, the probe may measure temperature over a predefined length of a measured surface as opposed to a single point on the measured surface. Still yet, the probe may include a shaped thermocouple array. Further again, at least one thermocouple may extend beyond an outer surface of the rod.

In a further embodiment, a method is provided for forming an in-contact temperature probe. The method may include selecting a shape for the in-contact temperature probe that conforms to a shape of a measured surface, forming a mold that conforms to the selected shape of the in-contact temperature probe, inserting a molding tube into the mold, drilling at least one hole in a surface of the molding tube, placing at least one thermocouple inside the molding tube, injecting thermally conductive adhesive into the molding tube to form an in-contact temperature probe structure, and curing the in-contact temperature probe structure. Further, the method may include injecting the thermally conductive adhesive such that no air gaps form in the in-contact temperature probe structure. Still yet, the at least one thermocouple and the thermally conductive adhesive may be selected to withstand temperatures up to 200 degrees Celsius. Moreover, multiple holes may be defined in the molding tube. Yet again, the in-contact temperature probe may be shaped to completely enclose an inner space. Further again, the in-contact temperature probe may be shaped to partially enclose an inner space. Still yet, the in-contact temperature probe may be shaped to measure temperature over a predefined length of the measured surface as opposed to a single point on the measured surface. Still further, a shaped thermocouple array may be formed.

Citation or identification of any document in this application is not an admission that such a document is available as prior art to the present disclosure.

BRIEF DESCRIPTION OF THE DRAWINGS

The construction designed to carry out the disclosure will hereinafter be described, together with other features thereof. The disclosure will be more readily understood from a reading of the following specification and by reference to the accompanying drawings forming a part thereof, wherein an example of the disclosure is shown and wherein.

Figure 1:
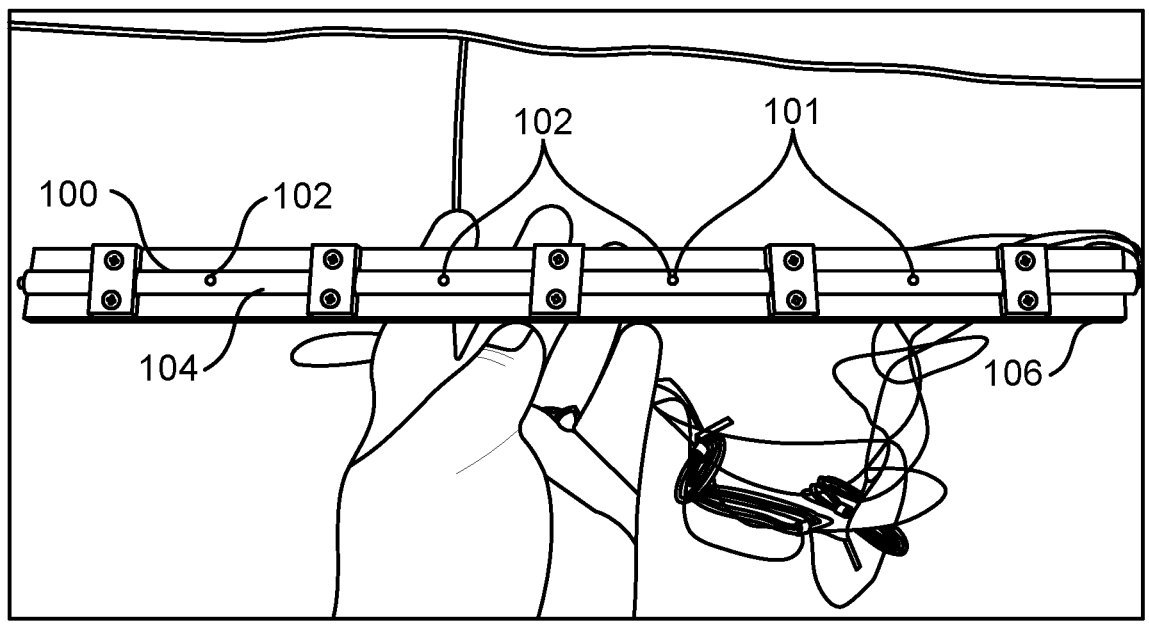
FIG. 1 shows a hollow tube that may be used to form probes of the current disclosure.

It will be understood by those skilled in the art that one or more aspects of this disclosure can meet certain objectives, while one or more other aspects can meet certain other objectives. Each objective may not apply equally, in all its respects, to every aspect of this disclosure. As such, the preceding objects can be viewed in the alternative with respect to any one aspect of this disclosure. These and other objects and features of the disclosure will become more fully apparent when the following detailed description is read in conjunction with the accompanying figures and examples. However, it is to be understood that both the foregoing summary of the disclosure and the following detailed description are of a preferred embodiment and not restrictive of the disclosure or other alternate embodiments of the disclosure. In particular, while the disclosure is described herein with reference to a number of specific embodiments, it will be appreciated that the description is illustrative of the disclosure and is not constructed as limiting of the disclosure. Various modifications and applications may occur to those who are skilled in the art, without departing from the spirit and the scope of the disclosure, as described by the appended claims. Likewise, other objects, features, benefits and advantages of the present disclosure will be apparent from this summary and certain embodiments described below, and will be readily apparent to those skilled in the art. Such objects, features, benefits and advantages will be apparent from the above in conjunction with the accompanying examples, data, figures and all reasonable inferences to be drawn therefrom, alone or with consideration of the references incorporated herein.

The figures herein are for illustrative purposes only and are not necessarily drawn to scale.

DETAILED DESCRIPTION OF A PREFERRED EMBODIMENT

With reference to the drawings, the disclosure will now be described in more detail. Unless defined otherwise, all technical and scientific terms used herein have the same meaning as commonly understood to one of ordinary skill in the art to which the presently disclosed subject matter belongs. Although any methods, devices, and materials similar or equivalent to those described herein can be used in the practice or testing of the presently disclosed subject matter, representative methods, devices, and materials are herein described.

Unless specifically stated, terms and phrases used in this document, and variations thereof, unless otherwise expressly stated, should be construed as open ended as opposed to limiting. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise.

Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

All publications and patents cited in this specification are cited to disclose and describe the methods and/or materials in connection with which the publications are cited. All such publications and patents are herein incorporated by references as if each individual publication or patent were specifically and individually indicated to be incorporated by reference. Such incorporation by reference is expressly limited to the methods and/or materials described in the cited publications and patents and does not extend to any lexicographical definitions from the cited publications and patents. Any lexicographical definition in the publications and patents cited that is not also expressly repeated in the instant application should not be treated as such and should not be read as defining any terms appearing in the accompanying claims. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Where a range is expressed, a further embodiment includes from the one particular value and/or to the other particular value. The recitation of numerical ranges by endpoints includes all numbers and fractions subsumed within the respective ranges, as well as the recited endpoints. Where a range of values is provided, it is understood that each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure. For example, where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In addition, the phrase "about 'x' to 'y'", where 'x' and 'y' are numerical values, includes "about 'x' to about 'y'".

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

Unless defined otherwise, technical and scientific terms used herein have the same meaning as commonly understood by one of ordinary skill in the art to which this disclosure pertains. Definitions of common terms and techniques in molecular biology may be found in Molecular Cloning: A Laboratory Manual, 2nd edition (1989) (Sambrook, Fritsch, and Maniatis); Molecular Cloning: A Laboratory Manual, 4th edition (2012) (Green and Sambrook); Current Protocols in Molecular Biology (1987) (F. M. Ausubel et al. eds.); the series Methods in Enzymology (Academic Press, Inc.): PCR 2: A Practical Approach (1995) (M. J. MacPherson, B. D. Hames, and G. R. Taylor eds.): Antibodies, A Laboratory Manual (1988) (Harlow and Lane, eds.): Antibodies A Laboraotry Manual, 2nd edition 2013 (E. A. Greenfield ed.); Animal Cell Culture (1987) (R. I. Freshney, ed.); Benjamin Lewin, Genes IX, published by Jones and Bartlet, 2008 (ISBN 0763752223); Kendrew et al. (eds.), The Encyclopedia of Molecular Biology, published by Blackwell Science Ltd., 1994 (ISBN 0632021829); Robert A. Meyers (ed.), Molecular Biology and Biotechnology: a Comprehensive Desk Reference, published by VCH Publishers, Inc., 1995 (ISBN 9780471185710); Singleton et al., Dictionary of Microbiology and Molecular Biology 2nd ed., J. Wiley & Sons (New York, N.Y. 1994), March, Advanced Organic Chemistry Reactions, Mechanisms and Structure 4th ed., John Wiley & Sons (New York, N.Y. 1992); and Marten H. Hofker and Jan van Deursen, Transgenic Mouse Methods and Protocols, 2nd edition (2011).

As used herein, the singular forms "a", "an", and "the" include both singular and plural referents unless the context clearly dictates otherwise.

As used herein, "about," "approximately," "substantially," and the like, when used in connection with a measurable variable such as a parameter, an amount, a temporal duration, and the like, are meant to encompass variations of and from the specified value including those within experimental error (which can be determined by e.g. given data set, art accepted standard, and/or with e.g. a given confidence interval (e.g. 90%, 95%, or more confidence interval from the mean), such as variations of +/−10% or less, +/−5% or less, +/−1% or less, and +/−0.1% or less of and from the specified value, insofar such variations are appropriate to perform in the disclosure. As used herein, the terms "about," "approximate," "at or about," and "substantially" can mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

For the present disclosure, single/multiple thermocouple(s) may be embedded in the interior of a manufactured adhesive rod, which permits accurate measurement of the temperature, heat transfer data, and location of weak points in the current carrying lines. A thermocouple is an electrical device consisting of two dissimilar electrical conductors forming an electrical junction. A thermocouple produces a temperature-dependent voltage as a result of the thermoelectric effect, and this voltage can be interpreted to measure temperature. Thermocouples are a widely used type of temperature sensor. Possible materials for the thermocouple wiring include, but are not limited to nickel alloys such as chromel-constantan, iron-constantan, chromel-alumel, nicrosil-Nisil, copper-constantan, platinum alloys, platinum/rhodium alloys, tungsten/rhenium alloys, gold alloys, iron alloys, iridium allows, HTIR-TC (High Temperature Irradiation Resistant) thermocouples, etc. The wiring may be insulated with mica-glass tap, TFE-tape, TFE-glass tape, vitreous silica, glass braid, Skive TFE tape, ceramic fibers, polyvinyls, nylon, PVC, FEP, Kapton, Tefzel, PFA, T300, etc.

The disclosure provides an in-contact temperature measurement probe, which can measure temperature accurately and directly on the surface of a current carrying wire, rod, heater, or other device. The wire, rod, heater or other device may be a non-insulated electric-current carrying conductor The probe's size, shape, and other physical features depend on the object of interest and can be made according to the user's requirement. The probe is made from a higher thermal conductivity adhesive available in the market and the thermocouples are installed at specified locations on the probe. The detailed procedure for the creation of the thermocouple probe is described below. (1) The shape for molding the thermocouple probe is decided and finalized, for purposes of example only and not intended to be limiting, a circular thermocouple probe. (2) The mold for the thermocouple is created by using an aluminum rod with a groove that can fit a polytetrafluoroethylene (PTFE) (e.g., Teflon®) molding tube of the specified diameter. The molding tube may be solid or hollow in form, such as a solid rod or a hollow column of PTFE or a similar material. PTFE has one of the lowest coefficients of friction known, is hydrophobic, meaning neither water nor water-containing substances wet PTFE, is almost totally chemically inert and highly insoluble in most solvents or chemicals, has a large operating temperature range, proving thermally stable enough to be used between −328° F. and +500° F. without degrading, as well as has high flexural strength, even at low temperatures. Further PTFE has high electrical resistance and dielectric strength, especially at high radio frequencies. Other suitable materials include Other suitable materials may include, but are not limited to PTFE, FEP, PEEK, PFA, ETFE, PVDF, LCP, PCTFE, and/or PFA. These materials are chosen to withstand temperatures up to 200 degrees C.

(3) Several holes are drilled on one side of the Teflon tube for the injection of thermal adhesive. Thermal adhesive is a type of thermally conductive glue used for electronic components and heat sinks. It can be available as a paste (similar to thermal paste) or as a double-sided tape. It is commonly used to bond integrated circuits to heatsinks where there are no other mounting mechanisms available. The glue may be a two-part epoxy resin (usually for paste products) or cyanoacrylate (for tapes). The thermally conductive material can vary including metals, metal oxides, silica or ceramic microspheres. The latter are found in products that have much higher dielectric strength, although this comes at the cost of lower thermal conductivity. Possible examples of thermal adhesive include, but are not limited to, epoxy resins, such as Elecolit® 6207, Elecolit® 6601, Elecolit® 6603, Elecolit® 6604, Elecolit® 6616, Vitralit® 6129 all available from Panacol-USA, Inc., Torrington, Conn., silicone alone or with thermally conductive materials embedded, such as aluminum nitride, boron nitride, alumina, or beryllia, various polyurethanes, etc.

The number of holes to be drilled on the Teflon tube is directly proportional to the length of the Teflon tube. The lengths of the free thermocouples are measured and are inserted into the Teflon tube. (4) The thermal adhesive is prepared for injection using the hot bath and it is then transferred into a syringe. The highly viscous thermal adhesive is then injected into the Teflon tube making sure that there are no air gaps. (5) The assembled thermocouple probe and the thermocouples are cured at the specified temperature in a regular laboratory oven.

The shape of the probe is decided by the user and the cast for making the probe is manufactured using any non-stick material such as polytetrafluoroethylene (PTFE), one non-limiting example being Teflon, or other materials such as a three-layer coating using PTFE and PFA, one non-limiting example being Silverstone. The thermal adhesive is made into a paste as per the instructions provided by MSDS (Material Safety Data Sheet). The MSDS specifies the thermal adhesive properties such as material composition, curing cycle, temperature profile, etc. It also specifies the safety precautions to be taken while handling the material.

Figure 2:
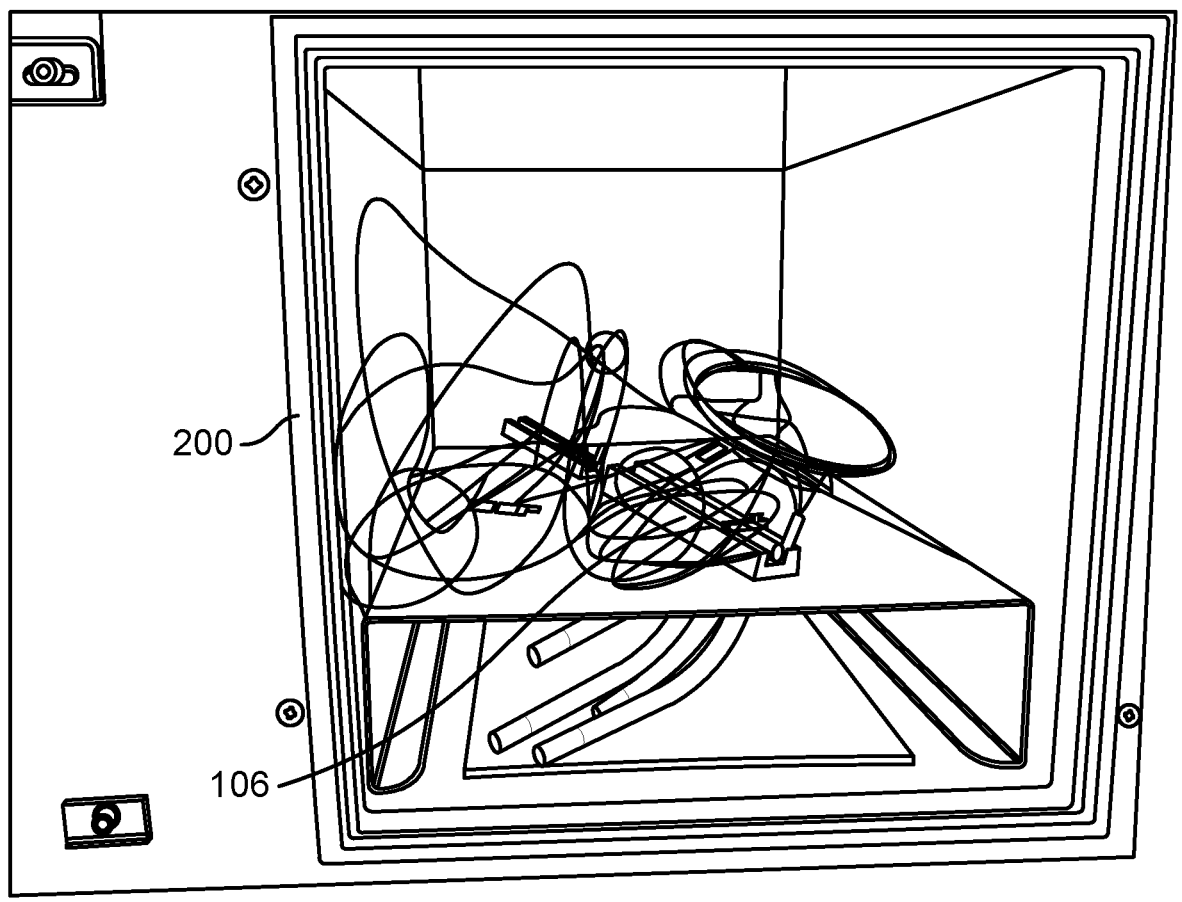
FIG. 2 shows an assembled tube structure of the current disclosure placed in a laboratory oven.

The length of each thermocouple to be inserted into the probe is measured using a ruler and marked using a permanent marker and inserted into the hollow tube/rod 100, which may be made of Teflon or another nonstick substance, see FIG. 1. A syringe, not shown, is then used to insert thermal adhesive 101 into tube 100 and complete filling is ensured by holes 102 defined within outer surface 104 of tube 100 to form an assembled tube structure 106. This allows uniform injection of the thermal adhesive without creation of air pockets within the tube. Assembled tube structure 106 is then placed in a regular laboratory oven 200, see FIG. 2, at 121° C. for 8 hours for the proper curing. Once the adhesive is cured, the outer Teflon casing is removed, and one may obtain the temperature probe ready for measurements.

The location of the holes in the tube is determined by the length of the tube. Placement of the thermocouples within the tube may be determined vis-à-vis the detection range of the thermocouples employed in the probe. For example, if the tube is twelve inches long and the thermocouples have a range of approximately one and one-half inches, then three holes may be drilled with three inch spacing on each side of the three holes to ensure the probes can measure temperature over a span of the tube. Further, thermocouples may be placed to ensure coverage along the entirety of the tube or only along portions of the tube. Such as, for purposes of example only and not intended to be limiting, thermocouples placed evenly along the tube length to report temperature along the tube's entire length from end-to-end. However, thermocouples may also be placed to only measure precise locations along the tube in order to avoid picking up heat/signatures/data from nearby elements that are not desired to be included in the measurement. This may include spacing thermocouples to only take temperature or other readings along the last four inches of the tube, or to take measurements at intervals along the tube length, such as at 2 to 4 inches, 6 to 8 inches, and 10 to 12 inches without measuring the temperature at the intervals between. While precise measurements have been discusses above, these are for purposes of example only and not intended to be limited with respect to thermocouples placement as various, even random, placement locations are considered within the scope of this disclosure.

Figure 3:
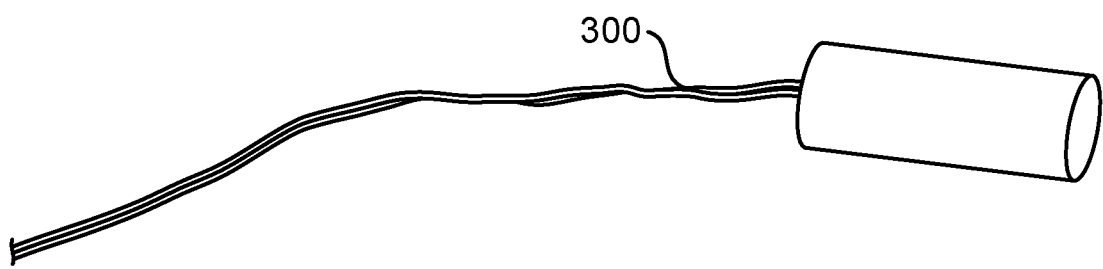
FIG. 3 shows a completed probe of the current disclosure.
Figure 4:
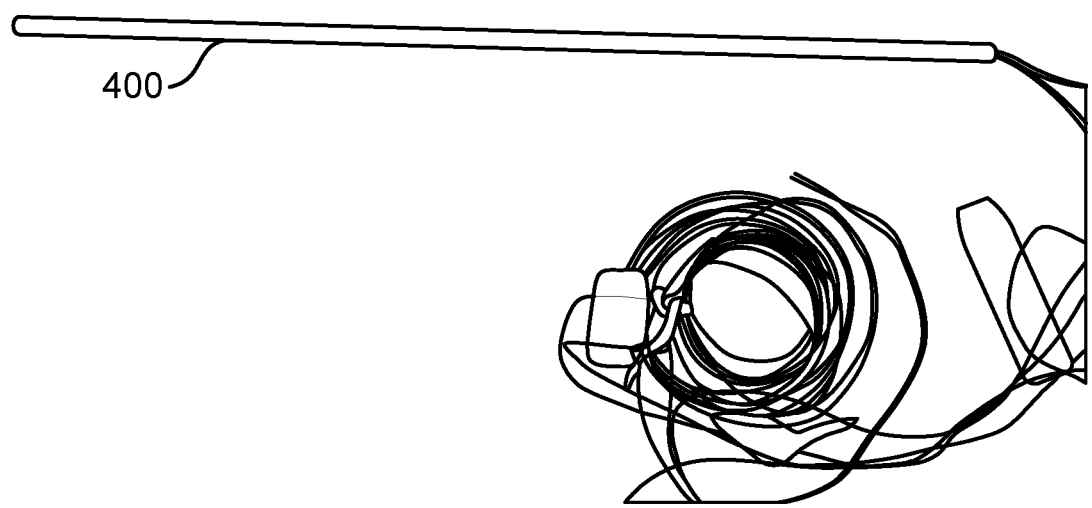
FIG. 4 shows an alternate embodiment of a completed probe of the current disclosure.

FIG. 3 shows a completed probe 300 and FIG. 4 shows an alternate embodiment of a completed probe 400 which may be produced pursuant to the current disclosure.

Figure 5:
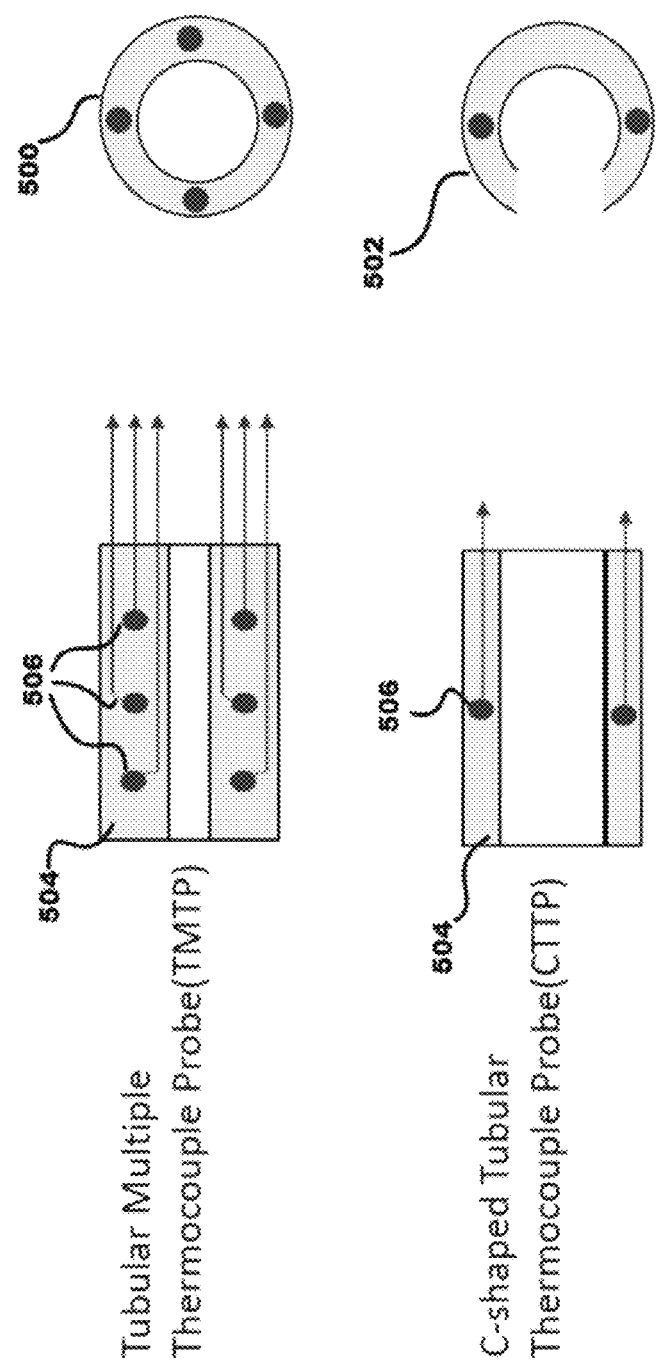
FIG. 5 shows transverse and cross-sectional views of probes of the current disclosure.

In a further embodiment, see FIG. 5, which shows transverse and cross-sectional views of probes of the current disclosure may be formed in a hollow tube shape 500, or a semi-circular shape or C-shape 502, to allow for completely or partially enclosing objects to be measured. Thus, tube shape 500 may completely surround/enclose and internal space. Indeed, thermocouple probe placement may be varied along probe surface 504 with multiple probe points 506 placed along probe surface 504. Tube shape 500 may be employed for measuring, for purpose of example only and not intended to be limited, a large diameter pipe. Meanwhile, semi-circular shape 502 may be employed for measuring, for purposes of example only and not intended to be limiting, small diameter objects such as conductive wires like copper.

Figure 6A:
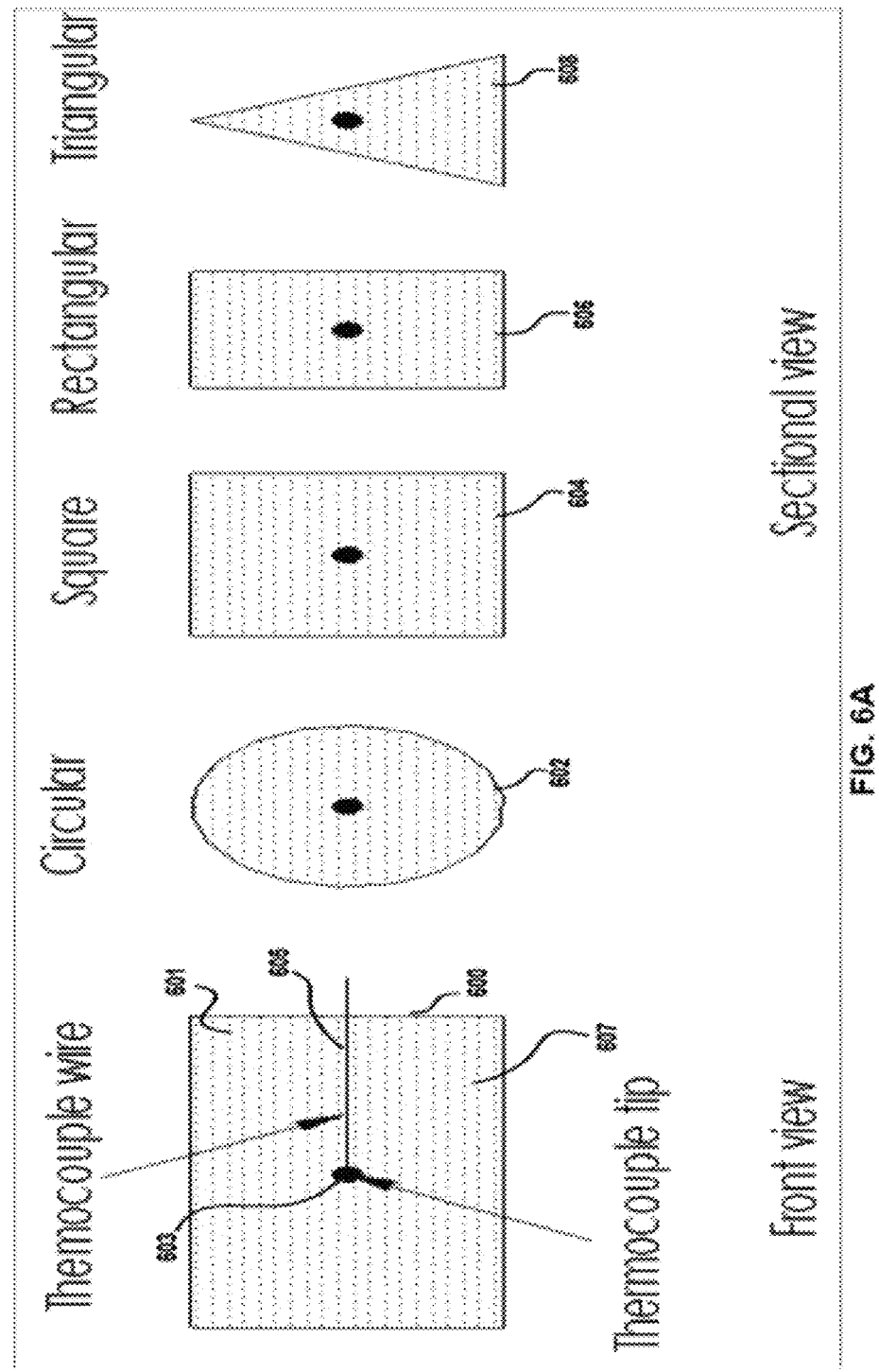
FIG. 6A shows solid state probe embodiments of the current disclosure.

FIG. 6A shows yet other possible embodiments of the current disclosure such as a solid-state probe 600, wherein probe body 601 is a substantially filled solid and thermocouple tip 603 and thermocouple wire 605 are contained within the material 607 forming probe body 601, that may be formed in myriad shapes such as circular 602, square 604, rectangular 606, and triangular 608. Other shapes, such as polyhedron, dome, star, etc., are considered within the scope of the disclosure and it should not be limited to just the provided examples, which are for informative purposes.

Figure 6B:
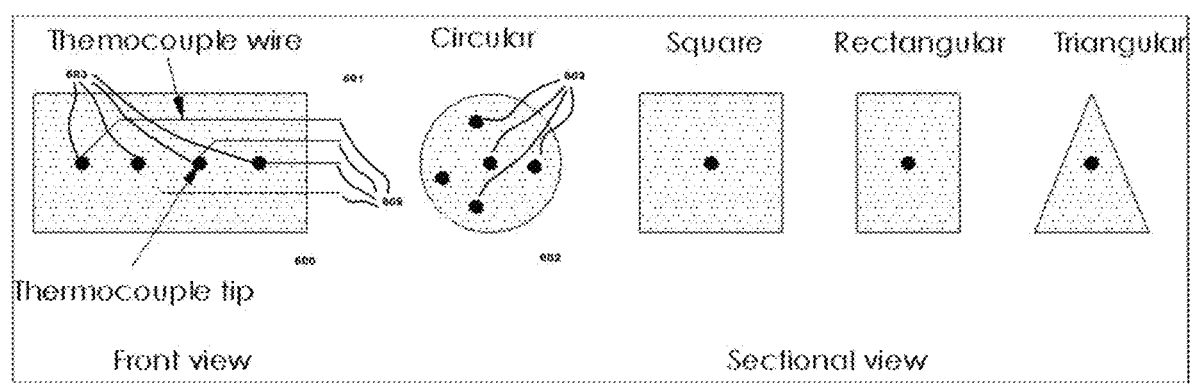
FIG. 6B shows that multiple thermocouple wires and multiple thermocouple tips may be placed within probes of the current disclosure.

FIG. 6B shows that multiple thermocouple wires 605 and multiple thermocouple tips 603 may be placed within probe body 601. While 6B shows a linear "single file line" placement, placement can be varied within probe body 601 as shown by circular probe 602, the resulting patterns may be regular, such as evenly spaced around a central core of forming uniform distances among tips 603 or irregular placement, as determined by the need and style of measurement. The multi-thermocouple probe is used in various applications ranging from nuclear reactor studies to temperature distribution over a microchannel to heat maps over solid bodies in wind tunnels. These multi-point thermocouple probes could be used by electricians and electrical personnel to ensure safety while dealing with live wires. A single point probe can measure only a temperature at a specified point, for example, temperature on a hot plate, inlet and outlet temperatures, etc. whereas the multi-point thermocouple probe can measure over a predefined length or the area of a surface. The locations of the thermocouples in the multi-point thermocouple probe is determined by the researcher or the electrician based on the study of temperature at particular regions or zones of interest. Since this thermocouple probe is customizable for specific purposes, the design can be optimized based on necessity.

Figure 7:
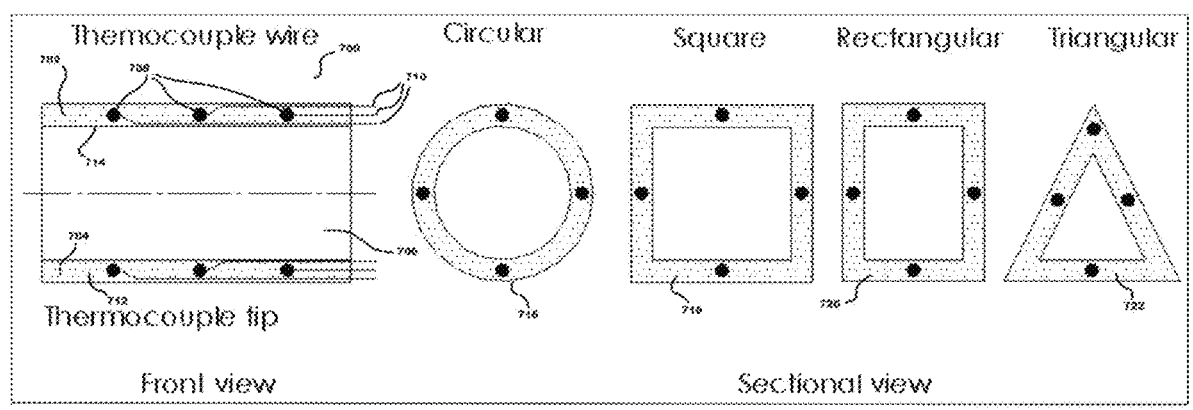
FIG. 7 shows hollow-structure embodiments of probes of the current disclosure.

FIG. 7 shows further alternative embodiments. Thermocouple probe 700 may be formed as a hollow structure 702 wherein an outer shell 704 defines a substantially empty or completely empty interior 706. Thermocouple tips 708 and thermocouple wires 710 may be placed within shell forming material 712 of outer shell 704. As discussed herein, tips 708 and wires 710 may be placed in various locations within outer shell 704 and may even extend through inner surface 714, or be flush therewith, of outer shell 704. FIG. 7 further shows that the probes may be circular 716, square 718, rectangular 720, and/or triangular 722. Other shapes, such as polyhedron, dome, star, etc., are considered within the scope of the disclosure and it should not be limited to just the provided examples, which are for informative purposes.

Figure 8:
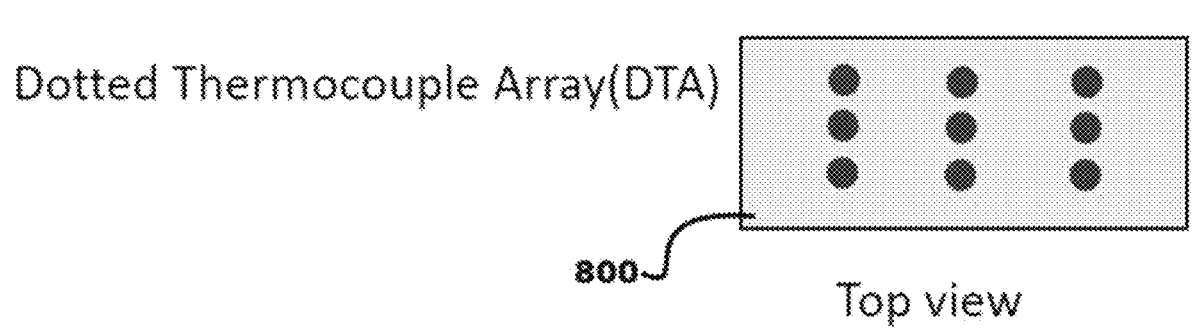
FIG. 8 shows a thermocouple array of the current disclosure.
Figure 9:
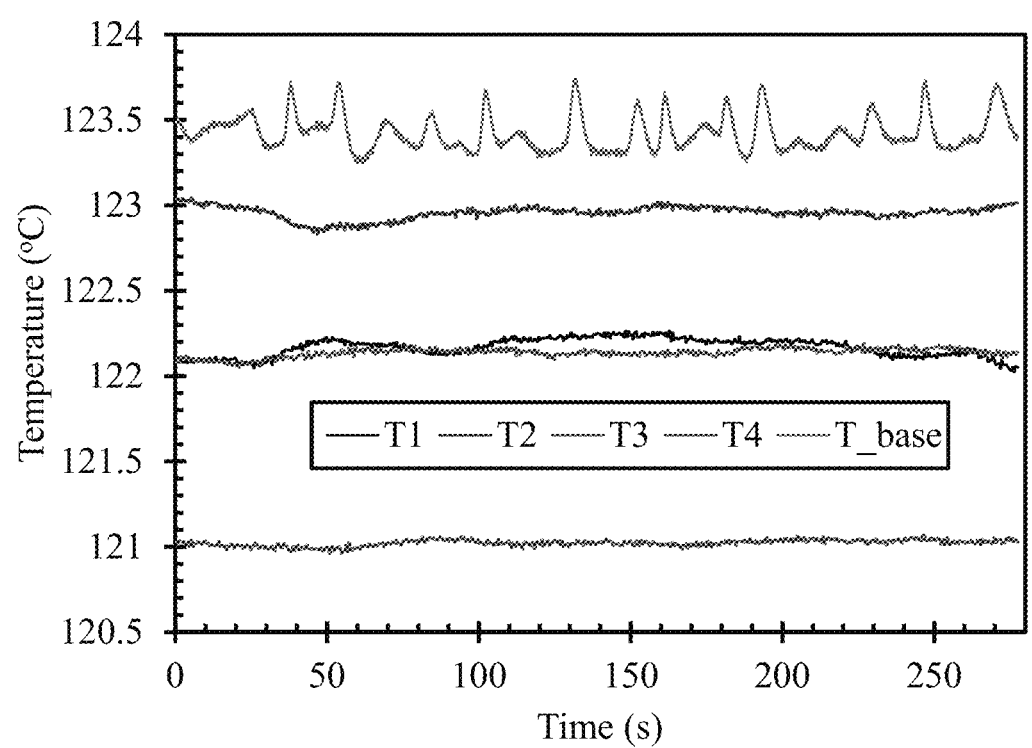
FIG. 9: Temperature Calibration for the multi-thermocouple probe in hot oil bath at 120° C.
Figure 10:
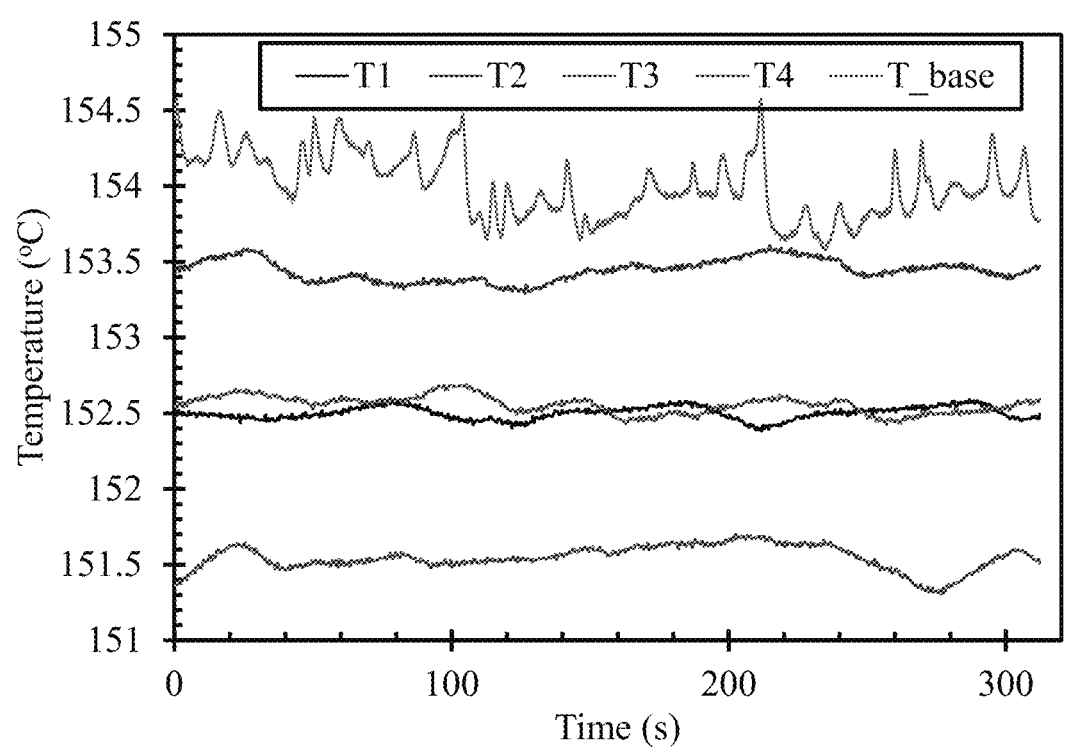
FIG. 10: Temperature Calibration for the multi-thermocouple probe in hot oil bath at 150° C.
Figure 11:
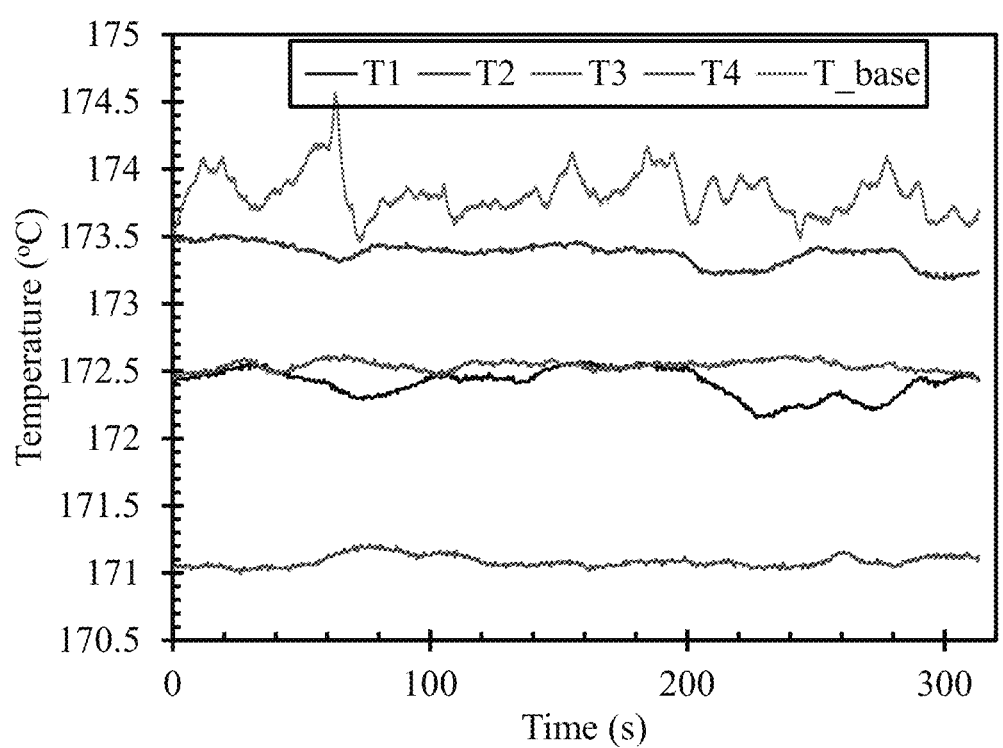
FIG. 11: Temperature Calibration for the multi-thermocouple probe in hot oil bath at 170° C.
Figure 12:
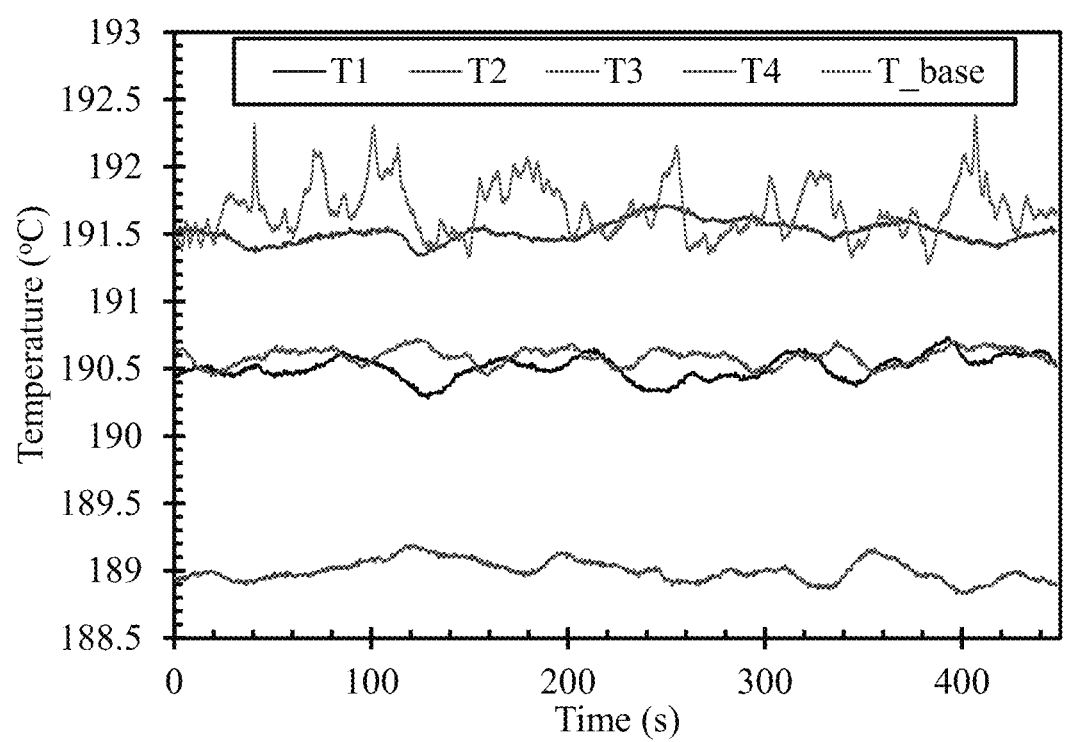
FIG. 12: Temperature Calibration for the multi-thermocouple probe in hot oil bath at 188° C.
Figure 13:
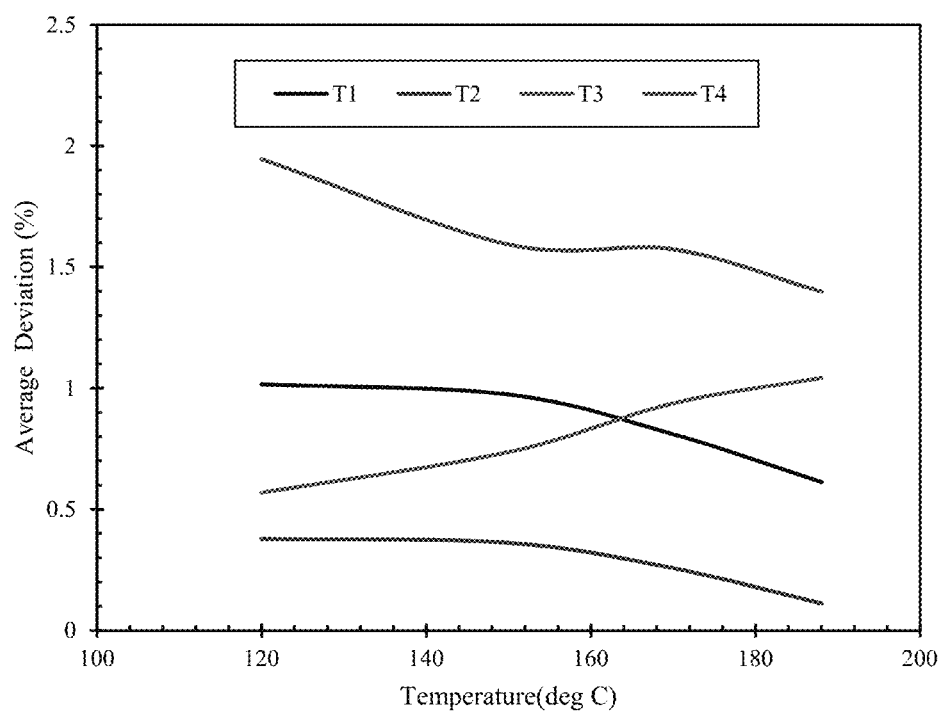
FIG. 13: Average deviation of the temperature probe temperature readings with respect to the free thermocouples
Figure 14:
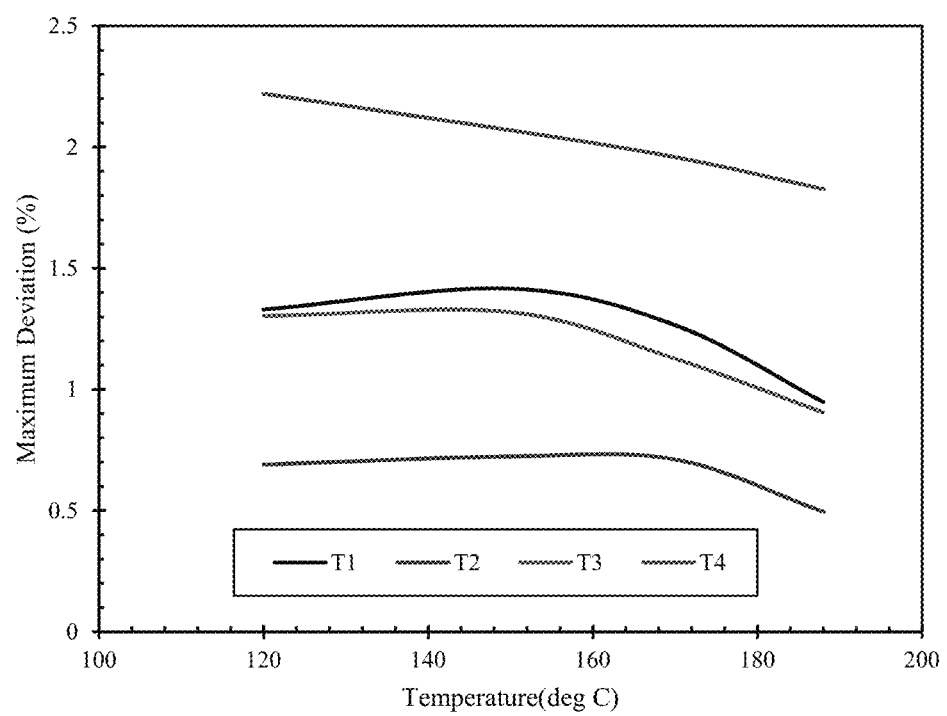
FIG. 14: Maximum deviation of the temperature probe temperature readings with respect to the free thermocouples
Figure 15:
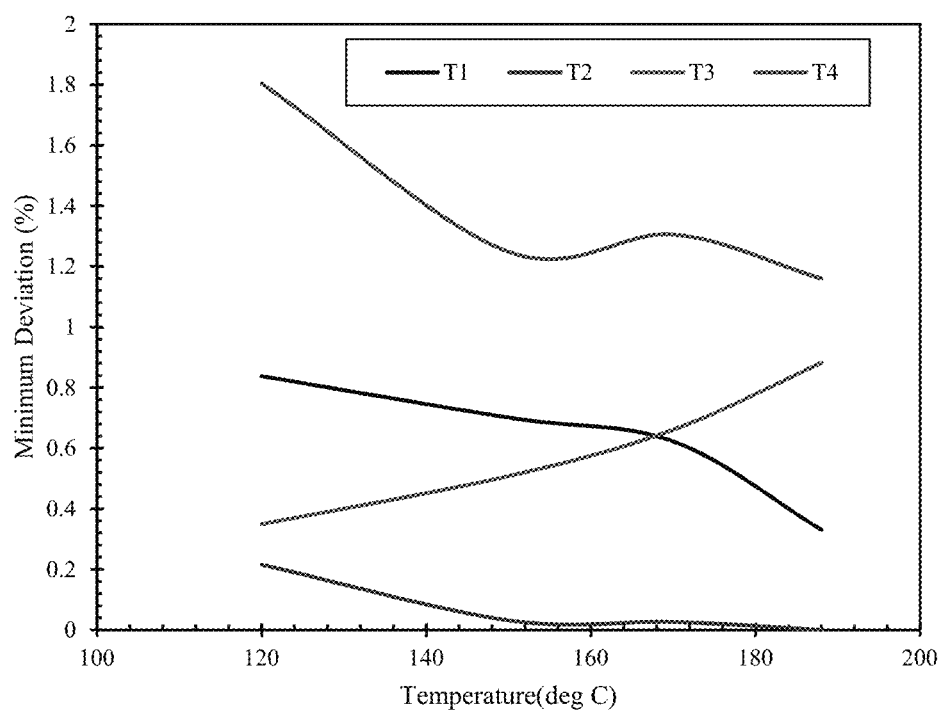
FIG. 15: Minimum deviation of the temperature probe temperature readings with respect to the free thermocouples
Figure 16:
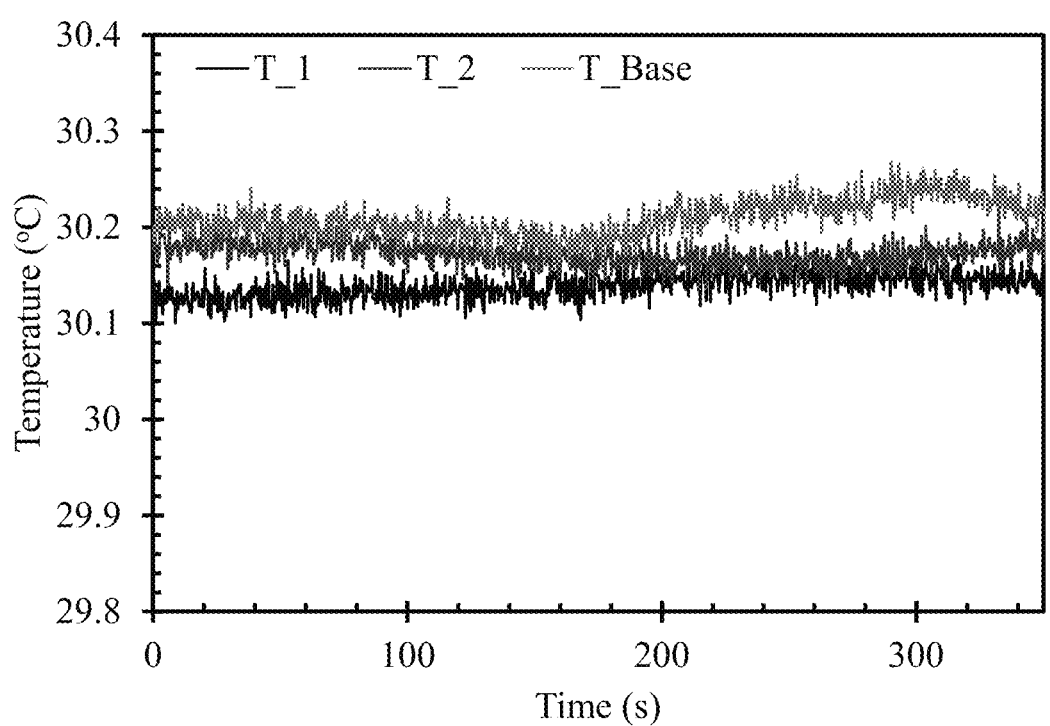
FIG. 16: Temperature Calibration for the single-thermocouple probe in hot oil bath at 30° C.
Figure 17:
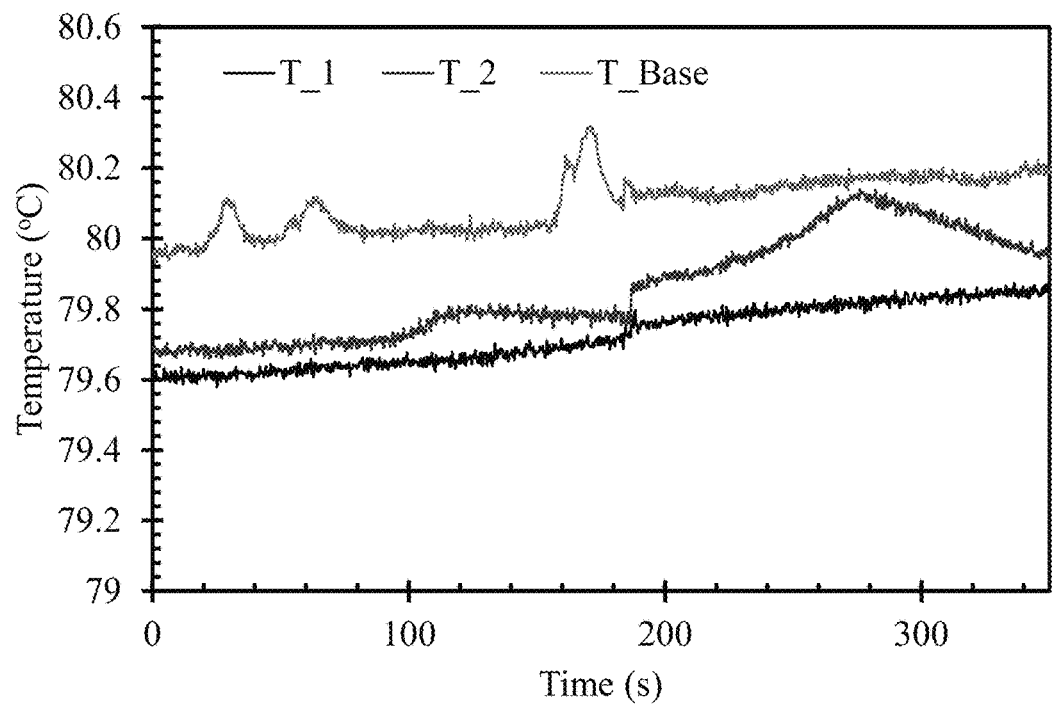
FIG. 17: Temperature Calibration for the two single-thermocouple probe in hot oil bath at 80° C.
Figure 18:
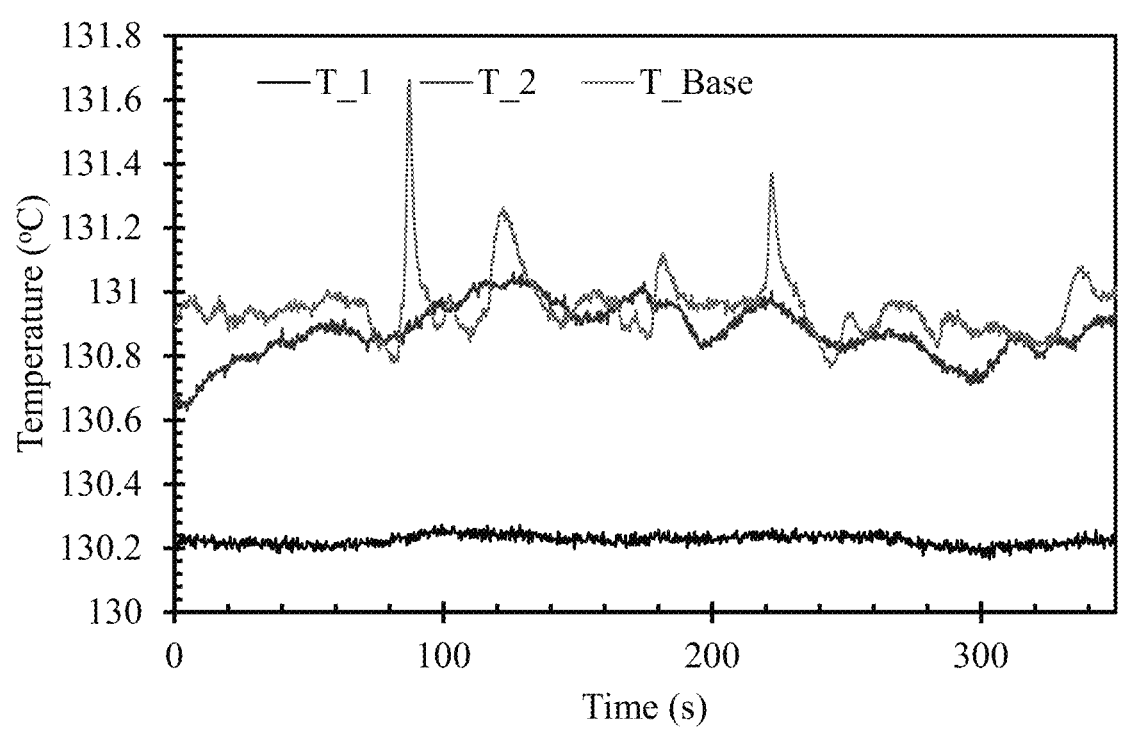
FIG. 18: Temperature Calibration for the two single-thermocouple probe in hot oil bath at 130° C.
Figure 19:
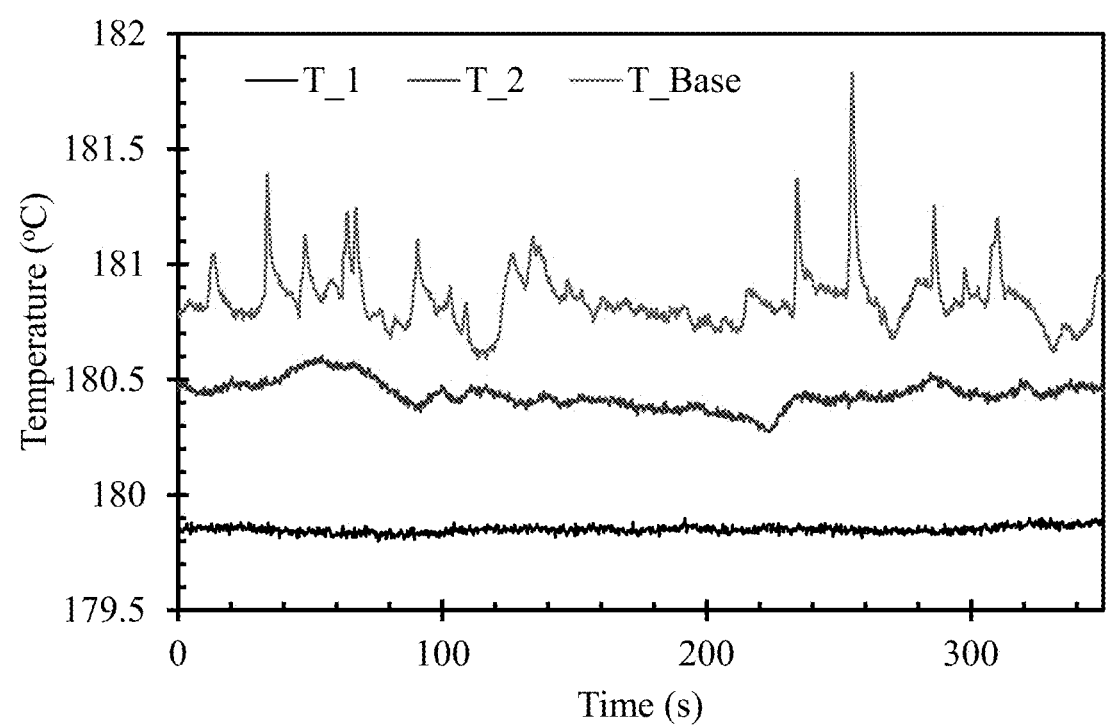
FIG. 19: Temperature Calibration for the two single-thermocouple probe in hot oil bath at 180° C.

FIG. 8 shows a thermocouple array 800. For instance, array 800 may be circular, such as coin shaped, such as 2"×2", 4"×4", 6"×6", etc. These arrays could be places on straight or curved surfaces to conduct readings. Further, this configuration would provide an excellent thermal map of an electrical conductor surface. By using these customized thermocouple arrays, the temperatures at various points across a straight, curved or angled cross-section could be measured without any difficulty. For example, in case of a curved pipe carrying hot fluids, the thermocouple array can be installed along the curvature of the pipes providing an edge over the existing thermocouples in the market. Thus, the temperature over a curved surface could be measured by an in-contact temperature measurement probe by virtue of ease of installation.

In a further embodiment, the thermal adhesive has higher thermal conductivity and electrical impedance and can be the best temperature measurement device for the safe measurement of temperature in a current carrying conductor. The physical dimensions of the probe are user-specific; hence it is one advantage of the current disclosure that probes derived therefrom may be molded into any shape. A probe of the current disclosure will enable an accurate in-contact temperature measurement of the electrical conductor. The temperature probe would also act as a Non-Destructive Testing tool in determining the hot spots (weaker surfaces with higher temperatures) in the electrical conductors.

The temperature probe of the current disclosure is thermally conductive and an excellent electrical insulator; hence, it can be used as an in-contact temperature measurement device for current carrying lines. This probe can be used to continuous measurement of the high resistive heater generally used in industry or in high-end research. It can also be used as a non-destructive testing tool to measure temperature in wires/boilers to detect hot spots and help in fixing the issue before any breakdown occurs. With this disclosure, in the near future, household wiring temperature measurements would be made possible.

The current disclosure solves the problem of the unavailability of probes for temperature measurement in an electrical current carrying conductor. This is a far safer measurement tool (since the material is an electrical insulator) and very affordable ($100-$500) compared with other kinds of tools found in the current market. This disclosure would minimize the risk of the personnel working in the high-power density environment providing a safer temperature measurement tool. Since the probe is capable of continuous temperature measurements in any shape and size and thermal conductivity of the material is reasonably high, the accuracy of probes of the current disclosure is within ±0.6° C. The manufactured single and multi-point thermocouple probes were inserted in a water bath and oil bath and temperatures were measured between 30° C. and 190° C. The deviation between the manufactured probe and the free thermocouple was found to be between 0% to 2.5%. Hence, the manufactured thermocouple probes have very high accuracy of temperature measurement.

Figure 20:
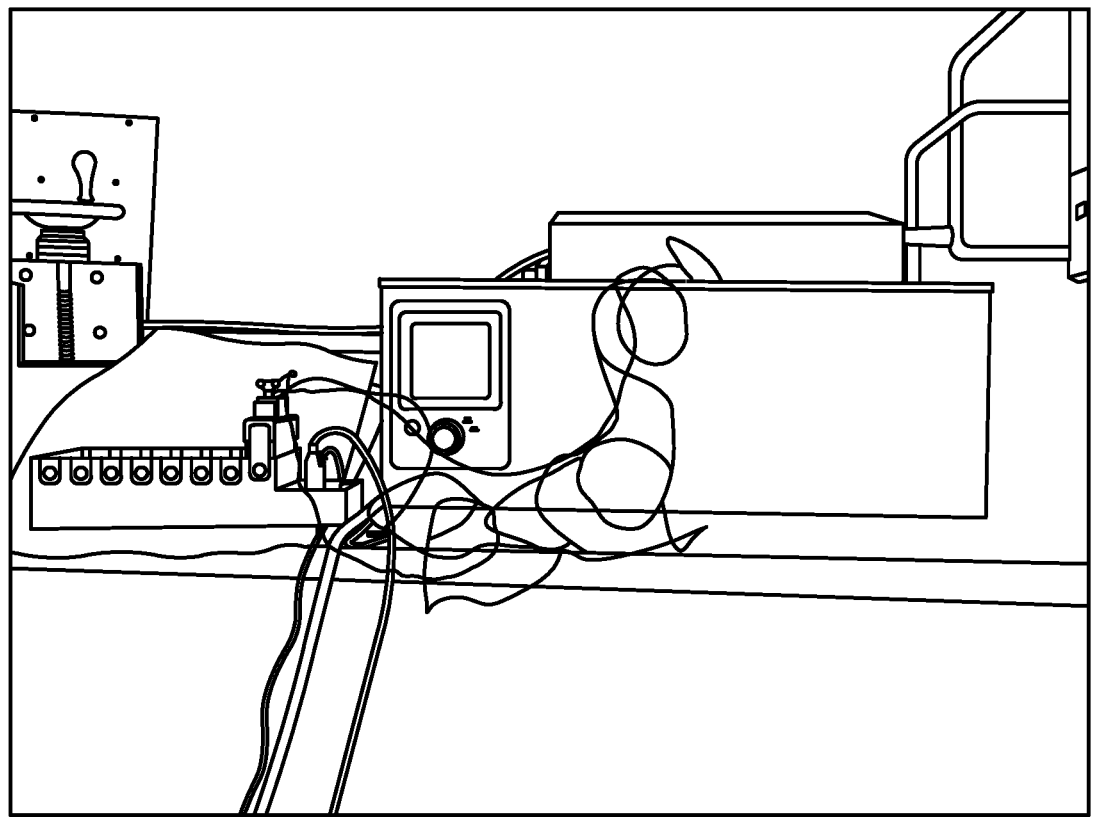
FIG. 20 shows an oil bath set-up of the current disclosure.

The temperature measurement probes made of thermal adhesives are placed inside an Inconel rod to simulate the actual test conditions for simulated nuclear fuel rod experiment. Two mediums of study are chosen for the test viz. water bath and oil bath. The Inconel rod with the probe is then placed in an oil bath and the temperature range from 30° C. to 188° C. in the safe operating range. The Inconel rod is then placed in a water bath and the temperature range from 30° C. to 98° C. (boiling condition). FIGS. 9 through 19 provide the experimental validation of the single and the multi-point thermocouple probes. The oil bath setup is shown in FIG. 20.

The single thermocouple and multi-thermocouple probe are connected to the NI 9211 DAQ and LABVIEW is used for data collection. A free thermocouple is also used for the comparison of the data obtained from the single and multi-thermocouple probes. The data is collected over 250-450 seconds time interval.

The manufacturing process of the current disclosure is extremely straightforward and does not require any advanced tooling skills and can be fabricated in a laboratory setup in schools and universities to mass manufacturing plants. This is a niche product that can be used for various applications and has a potential household use, hence this would be the first in the market and one-of-its-kind temperature measurement probe that can be used by students, electricians, thermal engineers, etc.

While the present subject matter has been described in detail with respect to specific exemplary embodiments and methods thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art using the teachings disclosed herein.

What is claimed is:

1. An in-contact temperature probe comprising:
    at least one thermocouple; and
    a non-electrically conducive rod wherein the at least one thermocouple is embedded within the rod;
    wherein the rod comprises at least one thermally conductive adhesive;
    wherein the in-contact temperature probe is shaped to conform to a measuring surface shape when placed in contact with the measuring surface; and
    wherein the measuring surface that the in-contact temperature probe contacts comprises a current carrying wire, rod, or heater.

2. The in-contact temperature measurement probe of claim 1, wherein the probe is designed to withstand temperatures up to 200 degrees Celsius.

3. The in-contact temperature probe of claim 1, wherein the rod includes multiple thermocouples with a number of the multiple thermocouples being proportional to a length of the rod.

4. The in-contact temperature probe of claim 1, wherein the probe detects temperature, heat transfer data, and/or location of weak points in current carrying lines contained in the measuring surface.

5. The in-contact temperature probe of claim 1, wherein the rod completely encloses an inner space.

6. The in-contact temperature probe of claim 1, wherein the rod partially encloses an inner space.

7. The in-contact temperature probe of claim 1, wherein the probe measures temperature over a predefined length of the measuring surface as opposed to a single point on the measuring surface.

8. The in-contact temperature probe of claim 1, wherein the at least one thermocouple is configured to form a shaped thermocouple array.

9. The in-contact temperature probe of claim 1, further comprising a portion of the at least one thermocouple extending beyond an outer surface of the rod.

10. An in-contact temperature probe comprising:
    at least one thermocouple;
    a non-electrically conducive rod wherein the at least one thermocouple is embedded within the rod;
    wherein the rod comprises at least one thermally conductive adhesive;
    wherein the in-contact temperature probe is shaped to conform to a measuring surface shape when placed in contact with the measuring surface; and
    wherein the rod includes multiple thermocouples with a number of the multiple thermocouples being proportional to a length of the rod.

* * * * *